(12) United States Patent
Jung

(10) Patent No.: US 7,687,316 B2
(45) Date of Patent: Mar. 30, 2010

(54) METHOD FOR ADHERING SEMICONDUCTOR DEVICES

(75) Inventor: Oh Jin Jung, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/122,083

(22) Filed: May 16, 2008

(65) Prior Publication Data

US 2008/0286900 A1 Nov. 20, 2008

(30) Foreign Application Priority Data

May 18, 2007 (KR) .................... 10-2007-0048575

(51) Int. Cl.
*H01L 23/48* (2006.01)
(52) U.S. Cl. ................ 438/109; 257/E23.011
(58) Field of Classification Search ......... 438/107–109, 438/455–459; 257/E23.011
See application file for complete search history.

(56) References Cited

U.S. PATENT DOCUMENTS

2005/0224921 A1* 10/2005 Gupta et al. ............... 257/621
2006/0057836 A1* 3/2006 Nagarajan et al. .......... 438/622

* cited by examiner

*Primary Examiner*—W. David Coleman
*Assistant Examiner*—Daniel Shook
(74) *Attorney, Agent, or Firm*—Finnegan, Henderson, Farabow, Garrett & Dunner, L.L.P.

(57) ABSTRACT

A method for adhering semiconductor devices is provided. The method includes forming a first semiconductor device including a first metal pad, forming a second semiconductor device including a second metal pad, adhering the first semiconductor device to the second semiconductor device, the first metal pad electrically connecting the second metal pad, and forming a heat sink via in the second semiconductor device.

14 Claims, 8 Drawing Sheets

METHOD FOR ADHERING SEMICONDUCTOR DEVICES

TECHNICAL FIELD

Embodiments consistent with the present invention relate to a method for adhering semiconductor devices, and more particularly, to a method for adhering semiconductor devices capable of preventing a crack phenomenon.

RELATED ART

In the semiconductor industry, for example, in system on chip (SOC) technology, researchers have attempted to integrate analog, RF, CPU, and CMOS sensors on one chip. However, realizing various devices having different design rules on one chip is very difficult and has many limitations.

In order to solve such a problem, a system in package (SIP) technology has been introduced. In SIP, two different semiconductor devices are connected to each other by a deep via conductor to reduce chip size and to secure enough storage capacity.

Generally, semiconductor devices are connected through deep via conductors having a high aspect ratio. Heat generated by a multi-level chip accumulates in the semiconductor devices, and can easily deteriorate the electrical and physical properties of the semiconductor devices.

For example, wafer bonding between the semiconductor devices is realized by the deep via conductors. In a package level, deep via conductors may crack due to the excessive heat accumulated in the semiconductor devices. Accordingly, to secure device reliability, the excessive heat needs be dissipated.

SUMMARY

Embodiments consistent with the present invention provide a method for adhering semiconductor devices including forming a heat sink via having a wide area. When semiconductor devices are adhered to each other, the heat sink via may dissipate thermal energy generated by the semiconductor devices, so as to prevent cracking of the semiconductor devices.

In accordance with one embodiment consistent with the present invention, the method for adhering semiconductor devices includes forming a first semiconductor device including a first metal pad, forming a second semiconductor device including a second metal pad, adhering the first semiconductor device to the second semiconductor device, the first metal pad electrically connecting the second metal pad, and forming a heat sink via in the second semiconductor device.

DETAILED DESCRIPTION

Hereinafter, embodiments consistent with the present invention will be described in detail with reference to the accompanying drawings so that they can be readily implemented by those skilled in the art.

FIGS. 1 to 17 are sectional views illustrating a method for adhering semiconductor devices in accordance with one embodiment consistent with the present invention.

Figure 1:
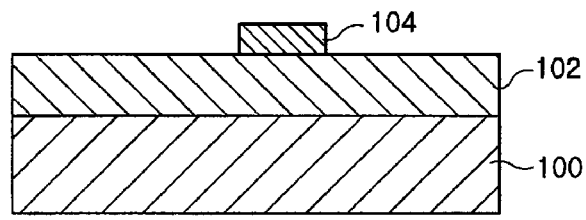
FIGS. 1 to 17 are sectional views illustrating a method for adhering semiconductor devices in accordance with one embodiment consistent with the present invention.
Figure 2:
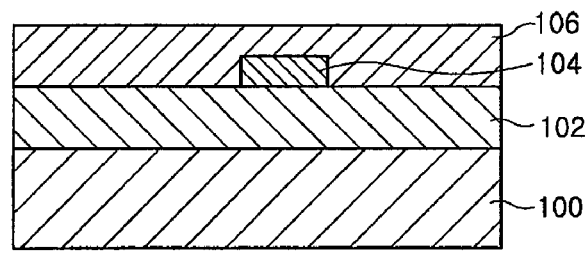

Specifically, FIGS. 1 to 9 illustrate a process for manufacturing a first semiconductor device consistent with the present invention and FIGS. 10 to 17 illustrate a process for forming a heat sink when a second semiconductor device consistent with the present invention is adhered to the first semiconductor device. As illustrated in FIGS. 1 and 2, after depositing an insulating layer 102 on a semiconductor substrate 100, an upper metal layer 104 is formed on insulating layer 102 and a gap fill layer 106 is formed on upper metal layer 104 and insulating layer 102. In one embodiment, insulating layer 102 may comprise a low dielectric material, such as an inter metal dielectric (IMD) layer for reducing capacitance between layers.

Figure 3:
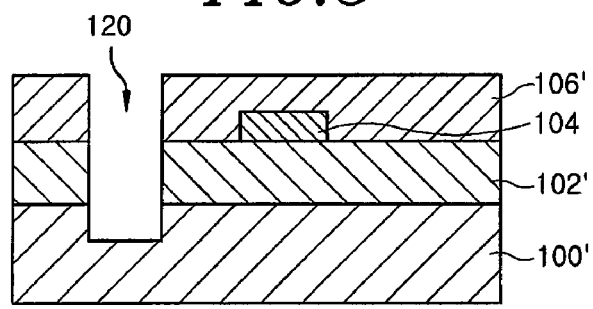

Then, as shown in FIG. 3, a via 120 is formed by sequentially etching gap fill layer 106, insulating layer 102, and semiconductor substrate 100. In FIG. 3, reference numerals 106', 102', and 100' respectively denote the gap fill layer, the insulating layer, and the semiconductor substrate after via 120 is formed.

Figure 4:
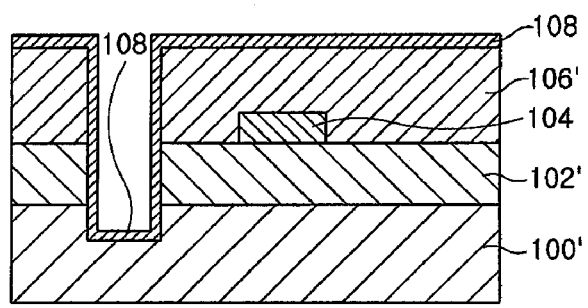
Figure 5:
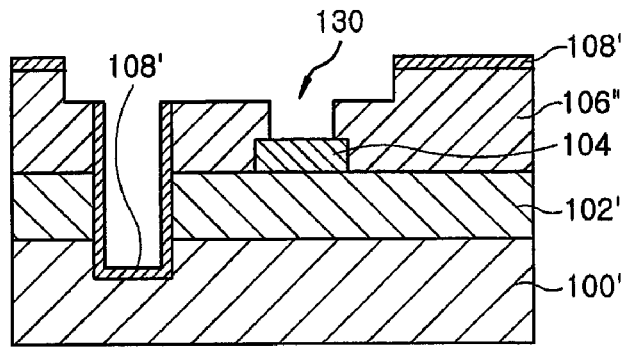

Then, as shown in FIGS. 4 and 5, a patterning auxiliary layer 108 is deposited on gap fill layer 106 and on surfaces of via 120, and a trench 130 is formed by etching a portion of patterning auxiliary layer 108 and a portion of gap fill layer 106' to expose an upper surface of upper metal layer 104. In one embodiment, pattern auxiliary layer 108 may comprise tetraethyl orthosilicate (TEOS). In FIG. 5, reference numerals 108' and 106'' respectively denote the patterning auxiliary layer and the gap fill layer after trench 130 is formed.

Figure 6:
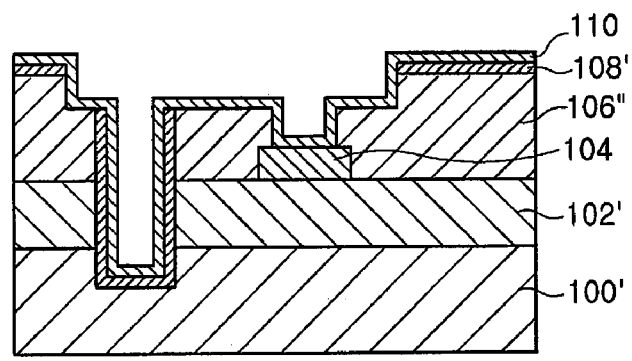

Then, as shown in FIG. 6, a diffusion preventing layer 110 is deposited on the resulting structure after trench 130 is formed. In one embodiment, diffusion preventing layer 110 may include a dielectric layer comprising, for example, TEOS, SiN, or SiC, and may have a thickness of about 3,000 Å to about 10,000 Å. In addition, diffusion preventing layer 110 may be deposited at a temperature of about 100° C. to about 700° C., a power of about 200 W to about 2,000 W, and a pressure of about 100 mtorr to about 30 torr.

Figure 7:
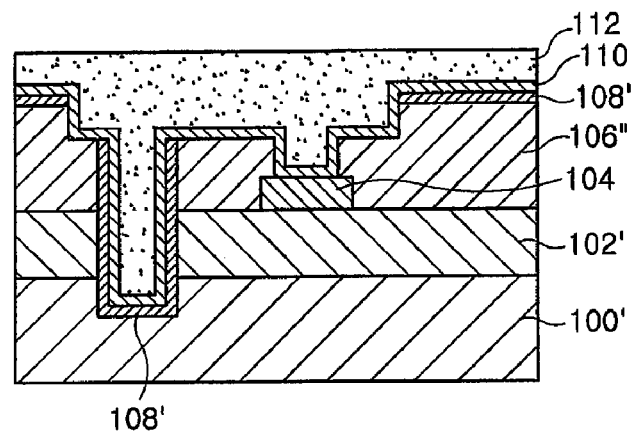

As shown in FIG. 7, a metal material 112 is formed on diffusion preventing layer 110. In one embodiment, metal material 112 may comprise tungsten (W) and copper (Cu). If metal material 112 comprises Cu, an electroplating method can be applied.

Figure 8:
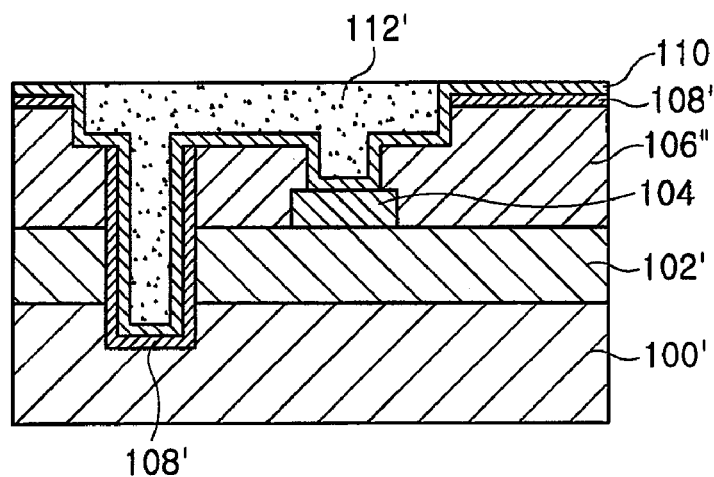

Then, as shown in FIG. 8, metal material 112 may be polished using a chemical mechanical polishing (CMP) process to expose diffusion preventing layer 110. In FIG. 8, reference numeral 112' denotes a metal material after the CMP process.

Figure 9:
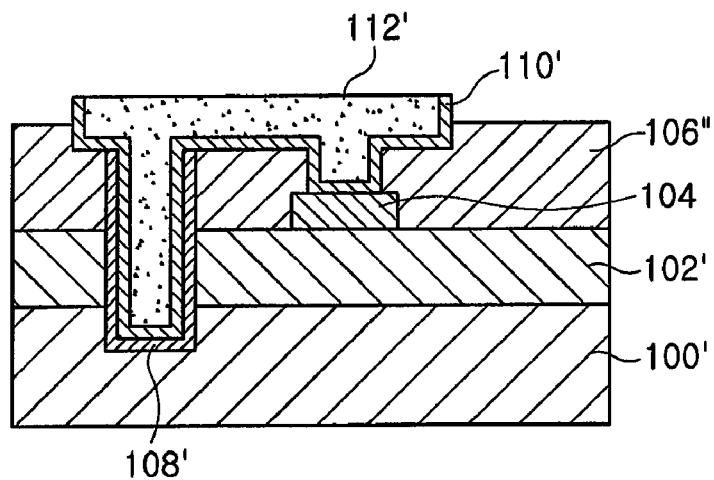

Referring to FIG. 9, a portion of diffusion preventing layer 110 and patterning auxiliary layer 108' are recessed or removed. As a result, metal material 112' protrudes from an upper surface of gap fill layer 106'' to form a metal pad. In FIG. 9, reference numeral 110' denotes the diffusion preventing layer after the metal pad is formed.

The first semiconductor device consistent with the present invention is thus formed.

Figure 10:
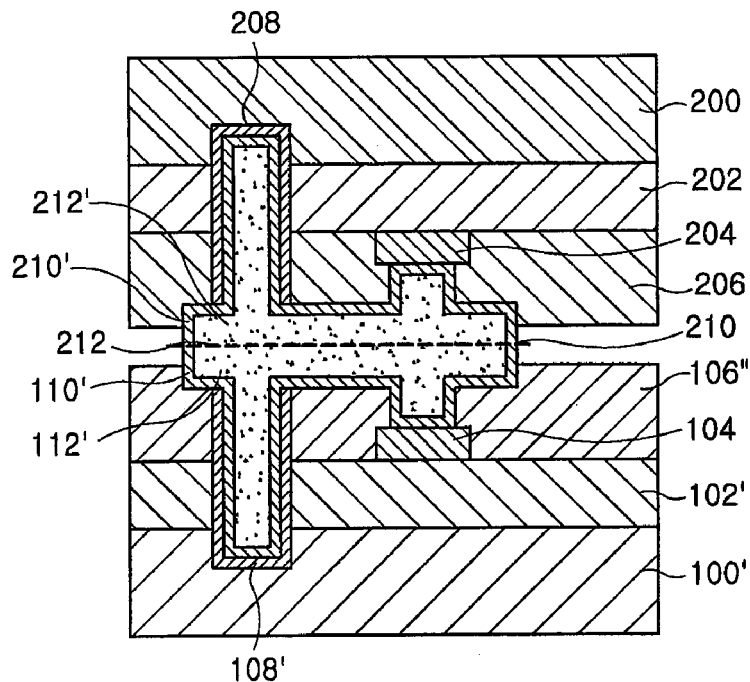

Referring to FIG. 10, a second semiconductor device, which may be identical to the first semiconductor device, is adhered to the first semiconductor device. The second semiconductor device may be fabricated by the same manufacturing process as that of the first semiconductor device, discussed above.

As illustrated in FIG. 10, the first semiconductor device is adhered to the second semiconductor device by a thermal diffusion method. Reference numerals 200, 202, 204, 206, 208, 210', and 212' respectively denote the semiconductor substrate, the insulating layer, the upper metal layer, the gap fill layer, the patterning auxiliary layer, the diffusion preventing layer, and the metal material of the second semiconductor device. In order to adhere the first semiconductor device to the second semiconductor device, metal material 112' and diffusion preventing layer 110' of the first semiconductor material are adhered to metal material 212' and diffusion preventing layer 210' of the second semiconductor device by the thermal diffusion method. In FIG. 10, reference numerals 210 and 212 respectively denote the diffusion preventing layer and the metal material after the first semiconductor device and the second semiconductor device are adhered to each other (hereinafter the first and second semiconductor devices).

Figure 11:
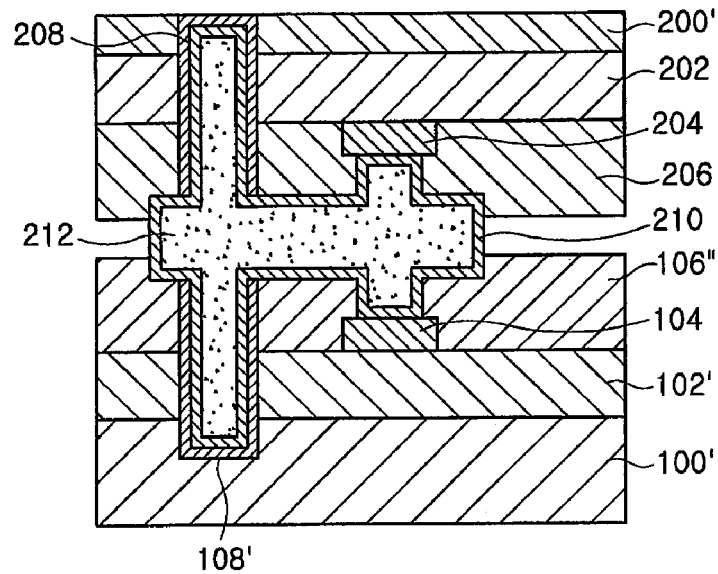

Referring to FIG. 11, a part of semiconductor substrate 200 of the second semiconductor device and a portion of patterning auxiliary layer 208 may be removed by a grinding and polishing process to expose a portion of diffusion preventing layer 210' of the second semiconductor device. As shown in FIG. 11, reference numeral 200' denotes the semiconductor substrate of the second semiconductor device after the grinding and polishing process.

Figure 12:
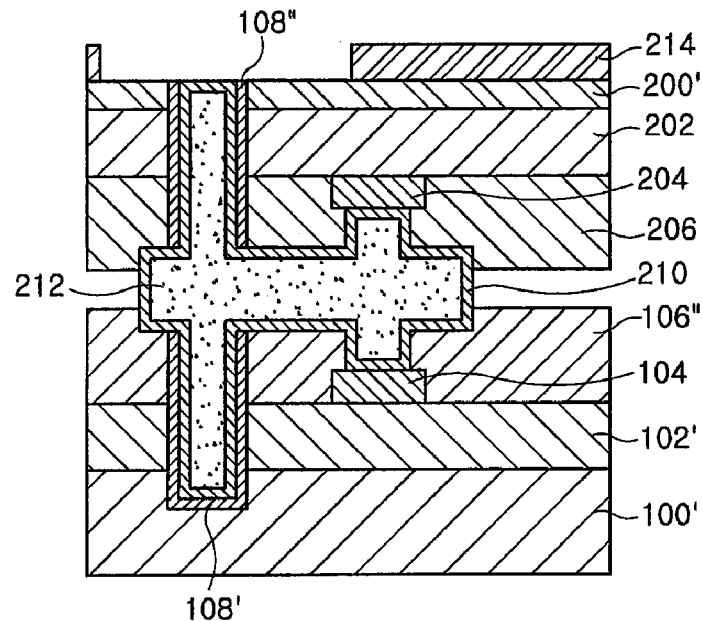

Then, as shown in FIG. 12, after depositing an interlayer dielectric layer (ILD) 214 on a rear surface of semiconductor substrate 200', interlayer dielectric layer 214 is patterned to expose diffusion preventing layer 210 and a first sectional surface of patterning auxiliary layer 108" of the first and second semiconductor devices.

Figure 13:
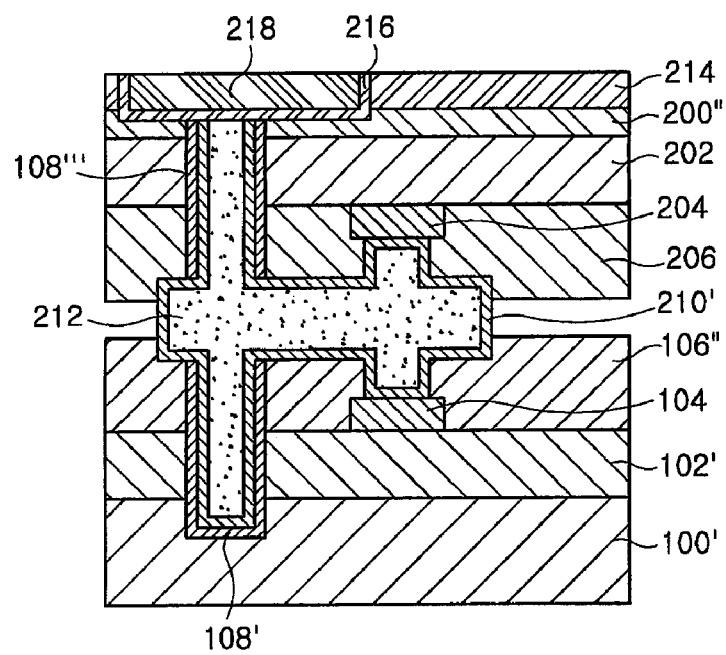

Then, as shown in FIG. 13, after removing parts of semiconductor substrate 200', diffusion preventing layer 210, and patterning auxiliary layer 108" of the first and second semiconductor devices, a second diffusion preventing layer 216 and a second metal material 218 are formed on semiconductor substrate 200', a second sectional surface of diffusion preventing layer 210, and the first sectional surface of patterning auxiliary layer 108". In one embodiment, metal material 218 may include Cu. In FIG. 13, reference numerals 200", 210", and 108''' denote the semiconductor substrate, the diffusion preventing layer, and the patterning auxiliary layer of the first and second semiconductor devices after the process shown in FIG. 13.

Figure 14:
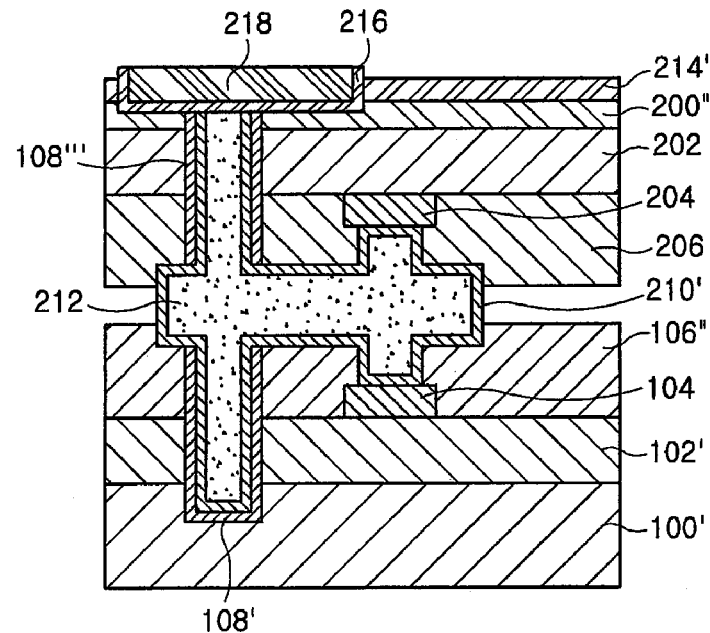

Referring to FIG. 14, a part of the interlayer insulating layer 214 is recessed (or removed) to form a metal pad. In FIG. 14, reference numeral 214' denotes the interlayer insulating layer after the metal pad is formed.

Figure 15:
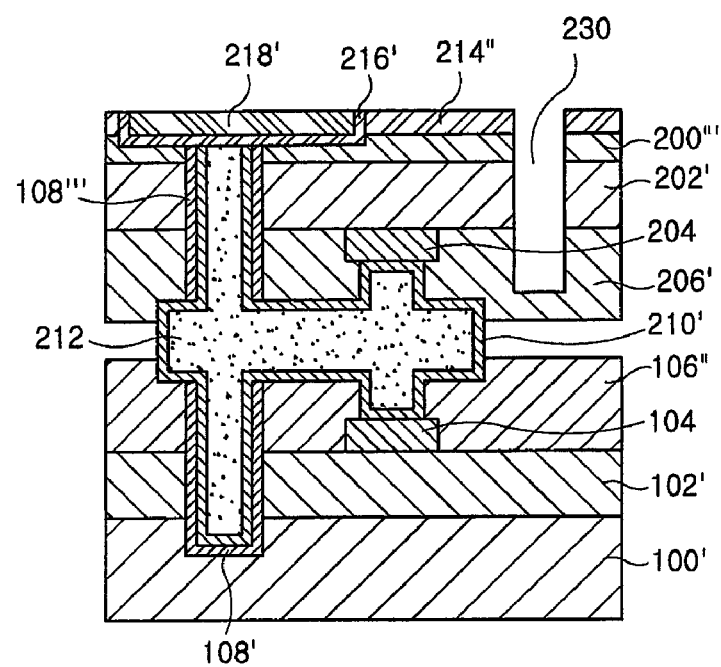

Referring to FIG. 15, after polishing the metal pad up until an upper surface of interlayer insulating layer 214', a deep via 230 is formed by etching interlayer insulating layer 214', semiconductor substrate 200", insulating layer 202, and gap fill layer 206 of the second semiconductor device. Deep via 230 may be a via trench of a heat sink for emitting thermal energy at a device level, when a semiconductor device includes stacked dies. Deep via 230 may have a depth of about 50 μm to about 100 μm.

In FIG. 15, reference numerals 214", 200''', 202', and 206' denote the interlayer insulating layer, the semiconductor substrate, the insulating layer, and the gap fill layer after forming deep via 230. In addition, reference numerals 216' and 218' denote the second diffusion preventing layer and the second metal material after being polished.

Figure 16:
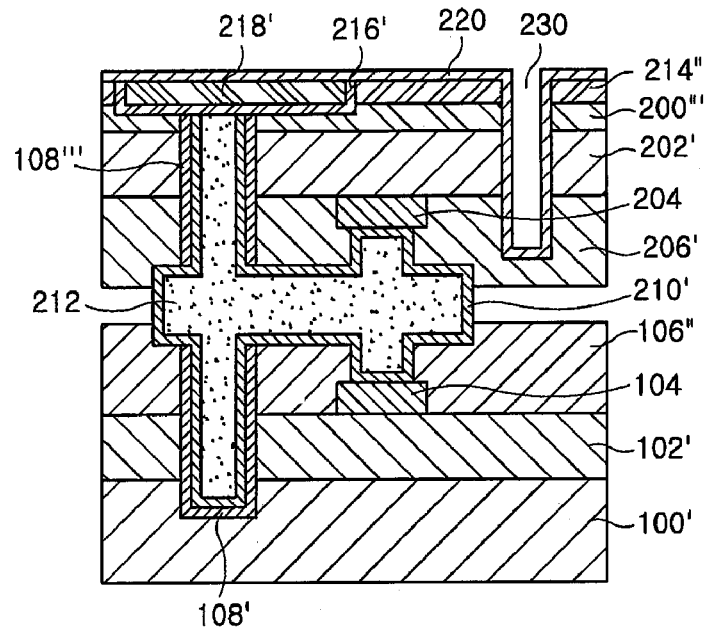

Then, referring to FIG. 16, a barrier metal 220 is deposited on interlayer insulating layer 214" and on surfaces of via 230. In one embodiment, barrier metal layer 220 may comprise one of aluminum (Al), Cu, gold (Au), silver (Ag), tantalum (Ta), titanium (Ti), or a mixture thereof, so as to dissipate thermal energy. Further, metal layer 220 may have a thickness of about 500 Å to about 2,000 Å.

Figure 17:
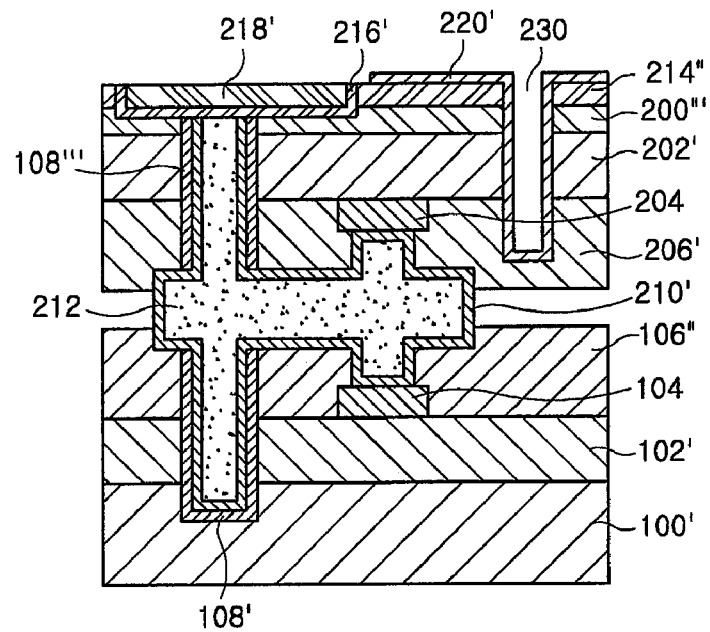

Referring to FIG. 17, a portion of barrier metal layer 220 on second diffusion preventing layer 216' and second metal material 218' is removed to insulate the metal pad from via 230. In FIG. 17, reference numeral 220' denotes the barrier metal layer after the removal process.

Figure 18:
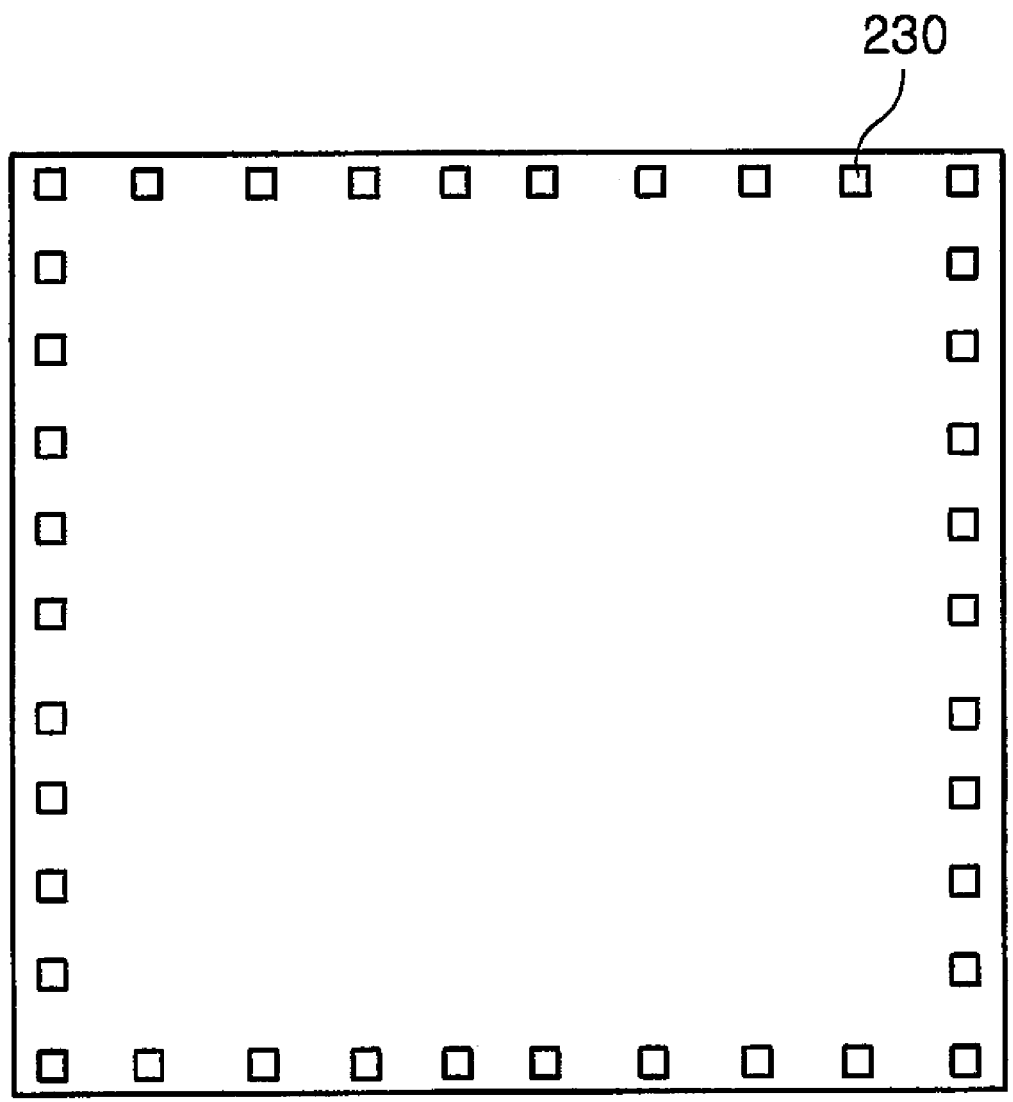
FIG. 18 is a plane view of a semiconductor device consistent with the present invention.

FIG. 18 is a plane view illustrating a semiconductor device having a plurality of vias 230 for heat sinks after performing the above-described process. Although semiconductor devices consistent with the present invention are adhered to each other, heat may be dissipated from the semiconductor devices through vias 230 acting as heat sinks, so as to secure the adhesion between the semiconductor devices.

While the present invention has been shown and described with respect to one or more embodiments, it will be understood by those skilled in the art that various changes and modifications may be made without departing from the spirit and scope of appended claims.

As described above, when different semiconductor devices are adhered to each other in the semiconductor system-in-package (SIP) process, the deep vias for heat sinks may quickly dissipate thermal energy from the semiconductor devices. Therefore, adhesion between semiconductor devices is not adversely affected by the heat accumulated in the semiconductor devices and the crack phenomenon can be prevented in the semiconductor devices.

What is claimed is:

1. A method for adhering semiconductor devices, comprising:
    forming a first semiconductor device including a first via filled with a first metal pad;
    forming a second semiconductor device including a second via filled with a second metal pad;
    adhering the first semiconductor device to the second semiconductor device, the first metal pad electrically connecting the second metal pad; and
    etching the second semiconductor device to form a heat sink via in the second semiconductor device.

2. A method for adhering a first semiconductor device and a second semiconductor device, the first semiconductor device including a first metal pad formed on an upper surface of the first semiconductor device, and the second semiconductor device including a second metal pad formed on an upper surface of the second semiconductor device, the method comprising:
    adhering the first semiconductor device to the second semiconductor device by contacting the first metal pad with the second metal pad; and
    etching the second semiconductor device from a bottom surface of the second semiconductor device to form a heat sink via in the second semiconductor device.

3. The method of claim 1, wherein forming the heat sink via comprises forming the heat sink via to have a depth of about 50 μm to about 100 μm.

4. The method of claim 1, wherein adhering the first semiconductor device to the second semiconductor device comprises adhering a first diffusion preventing layer of the first semiconductor device to a second diffusion preventing layer of the second semiconductor device.

5. The method of claim 1, wherein forming the first semiconductor device or forming the second semiconductor device comprises:
    forming an insulating layer on a semiconductor substrate;
    forming an upper metal layer on the insulating layer;
    forming a gap fill layer on the upper metal layer and the insulating layer;
    forming a first via by etching the gap fill layer, the insulating layer, and the semiconductor substrate;

forming a patterning auxiliary layer on the gap fill layer and on surfaces of the first via;
forming a trench to expose the upper metal layer;
forming a diffusion preventing layer on the portions of the gap fill layer, the patterning auxiliary layer, and the upper metal layer remaining after forming the trench;
forming a metal material layer on the diffusion preventing layer;
polishing the metal material layer to expose the diffusion preventing layer; and
forming a metal pad by removing parts of the patterning auxiliary layer and the diffusion preventing layer.

6. The method of claim 1, further comprising:
removing a part of a semiconductor substrate of the second semiconductor device to expose a portion of a diffusion preventing layer of the second semiconductor device;
forming an interlayer insulating layer on the semiconductor substrate of the second semiconductor device and on the exposed portion of the diffusion preventing layer; and
patterning the interlayer insulating layer to expose the diffusion preventing layer and a patterning auxiliary layer of the second semiconductor device;
removing parts of the semiconductor substrate, the diffusion preventing layer, and the patterning auxiliary layer of the second semiconductor device;
forming a second diffusion preventing layer on the semiconductor substrate, the diffusion preventing layer, and the patterning auxiliary layer;
forming a second metal material layer on the second diffusion preventing layer;
forming a metal pad by removing a part of the interlayer insulating layer;
polishing the metal pad up to an upper surface of the interlayer insulating layer;
etching the interlayer insulating layer, the semiconductor substrate of the second semiconductor device, an insulating layer of the second semiconductor device, and a gap fill layer of the second semiconductor device to form the heat sink via;
depositing a barrier metal layer on the heat sink via; and
removing a portion of the barrier metal layer on the second diffusion preventing layer and the second metal material to insulate the metal pad from the heat sink via.

7. The method of claim 4, wherein adhering the first semiconductor device to the second semiconductor device comprises adhering the first semiconductor device to the second semiconductor device using a thermal diffusion method.

8. The method of claim 5, wherein the diffusion preventing layer comprises one of TEOS, SiN, and SIC.

9. The method of claim 5, wherein forming the diffusion preventing layer comprises forming the diffusion preventing layer at a temperature of about 100° C. to about 700° C., a power of about 200 W to about 2,000 W, and a pressure of about 100 mtorr to about 30 torr.

10. The method of claim 6, wherein the barrier metal layer comprises one of Al, Cu, Au, Ag, Ta, and Ti.

11. The method of claim 6, wherein the barrier metal layer comprises a mixture of at least one of Al, Cu, Au, Ag, Ta, and Ti.

12. The method of claim 2, further comprising:
depositing a barrier metal layer on the bottom surface of the second semiconductor device and on the heat sink via; and
removing a portion of the barrier metal layer on the bottom surface of the second semiconductor device to insulate the second metal pad from the heat sink via.

13. The method of claim 2, wherein the second semiconductor device includes a substrate having an upper surface and a bottom surface, an insulating layer formed on the upper surface of the substrate, a gap fill layer formed on the insulating layer, and an interlayer insulating layer formed on the bottom surface of the substrate.

14. The method of claim 13, wherein etching the second semiconductor device comprises:
etching the interlayer insulating layer, the substrate, the insulating layer, and the gap fill layer to form the heat sink via.

* * * * *